United States Patent
Chou et al.

(10) Patent No.: US 9,347,981 B2
(45) Date of Patent: May 24, 2016

(54) TEST METHOD FOR INTERPOSER

(71) Applicant: Industrial Technology Research Institute, Hsinchu (TW)

(72) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 230 days.

(21) Appl. No.: 13/784,836

(22) Filed: Mar. 5, 2013

(65) Prior Publication Data
US 2014/0139259 A1    May 22, 2014

(30) Foreign Application Priority Data
Nov. 19, 2012   (TW) .............................. 101143147 A

(51) Int. Cl.
*G01R 31/28*   (2006.01)
*G01R 31/02*   (2006.01)
*G01R 31/04*   (2006.01)

(52) U.S. Cl.
CPC .......... *G01R 31/2801* (2013.01); *G01R 31/026* (2013.01); *G01R 31/04* (2013.01)

(58) Field of Classification Search
CPC .................................................. G01R 31/2853
See application file for complete search history.

(56) References Cited

U.S. PATENT DOCUMENTS

| | | | |
|---|---|---|---|
| 6,927,593 B2 | 8/2005 | Kline | |
| 7,330,040 B2 | 2/2008 | Ma | |
| 7,863,106 B2 | 1/2011 | Christo et al. | |
| 8,718,545 B2 * | 5/2014 | Lepek | 455/41.1 |
| 2007/0152316 A1 | 7/2007 | Ryu et al. | |
| 2008/0242331 A1 * | 10/2008 | Rofougaran | 455/517 |
| 2009/0138217 A1 | 5/2009 | Bufe | |
| 2011/0148456 A1 | 6/2011 | Mooyman-Beck et al. | |
| 2012/0126008 A1 * | 5/2012 | Binmore | 235/439 |
| 2013/0249589 A1 * | 9/2013 | Chen et al. | 324/762.01 |

FOREIGN PATENT DOCUMENTS

| | | |
|---|---|---|
| CN | 202025057 U | 11/2011 |
| TW | I264551 | 10/2006 |

(Continued)

OTHER PUBLICATIONS

"Office Action of Taiwan Counterpart Application", issued on Jul. 25, 2014, p. 1-p. 9.

(Continued)

*Primary Examiner* — Tung X Nguyen
*Assistant Examiner* — Feba Pothen
(74) *Attorney, Agent, or Firm* — Jianq Chyun IP Office

(57) ABSTRACT

A test method for an interposer is provided. The interposer includes a plurality of conductive lines therein and a plurality of connecting contacts thereon, wherein the connecting contacts are electrically connected to the conductive lines. The test method for an interposer provides a passive transponder device. The passive transponder device includes a first circuit including an open/short test circuit and at least a pair of connecting contacts. The test method for an interposer includes contacting the connecting contacts of the first circuit in the passive transponder device with the selected contacts on the interposer to form a checking area and conducting an open-circuit or short-circuit test for the interposer through the checking area.

13 Claims, 3 Drawing Sheets

(56) References Cited

FOREIGN PATENT DOCUMENTS

| TW | 201028847 | 8/2010 |
|---|---|---|
| TW | 201201299 | 1/2012 |
| TW | 201208031 | 2/2012 |

OTHER PUBLICATIONS

Ken Smith, et al., "Evaluation of TSV and Micro-Bump Probing for Wide I/O Testing", IEEE, International Test Conference (ITC), Sep. 2011, pp. 1-10.

Pierre Bar, et al., "A Silicon Platform With Through-Silicon Vias for Heterogeneous RF 3D Modules", IEEE, Proceedings of the 41st European Microwave Conference, Oct. 2011, pp. 1173-1176.

C. Fuchs, et al., "Process and RF modelling of TSV last approach for 3D RF interposer", IEEE, Interconnect Technology Conference and 2011 Materials for Advanced Metallization (IITC/MAM), May 2011, pp. 1-3.

D.C. Keezer, et al., "A Test Strategy for Nanoscale Wafer Level Packaged Circuits", IEEE, 4th Electronics Packaging Technology Conference, Dec. 2002, pp. 175-179.

Deng Chun, et al., "A MEMS Based Interposer for Nano-Wafer Level Packaging Test", IEEE, Electronics Packaging Technology Conference, Dec. 2003, pp. 405-409.

Chun-Chuan Chi, et al., "Post-Bond Testing of 2.5D-SICs and 3D-SICs Containing a Passive Silicon Interposer Base", IEEE, International Test Conference (ITC), Sep. 2011, pp. 1-10.

Erik Jan Marinissen, "Challenges and Emerging Solutions in Testing TSV-Based 2 1/2D- and 3D-Stacked ICs", IEEE, Design, Automation & Test in Europe Conference & Exhibition (Date), Mar. 2012, pp. 1277-1282.

* cited by examiner

TEST METHOD FOR INTERPOSER

CROSS-REFERENCE TO RELATED APPLICATION

This application claims the priority benefit of Taiwan application serial no. 101143147, filed on Nov. 19, 2012. The entirety of the above-mentioned patent application is hereby incorporated by reference herein and made a part of this specification.

BACKGROUND

1. Technical Field

The disclosure relates to a test method for an interposer.

2. Related Art

The interposer is a carrier, containing conductive lines and connecting contacts, on which semiconductor chips can be stacked and bonded in a close proximity. The interposer, like a printed wiring board, does not need to have any active component, but the size of the connecting contacts may be relatively small (less than 20 microns), and the quantity may be relatively large (greater than 200,000). Therefore, it is more difficult to use a contact test method to test the connections of all the conductive lines and the connecting contacts, compared to the printed wiring board. However, if the semiconductor chips are bonded to the interposer without testing the interposer first, then it has to be accepted that there will be a certain degree of risk in that the yield of the interposer is low.

For instance, the field programmable gate array (FPGA) product can stack three or four FPGA chips (called slices or regions) on the interposer using the advanced fabrication technique to form a larger chip with extraordinary capacity. Although the interposer may only be a carrier that is relatively cheap, compared to the high-end semiconductor chips stacked on top of it, the chips, once bonded to the interposer, cannot be removed when an error is found afterwards. Since the interposer does not have any active component, to apply a built-in self-test method to the interposer alone is not able to conduct. If the chips are connected to a defective interposer, the chips will be wasted, resulting in an expensive loss. Therefore, to reduce the risk of fabrication, an external test method for the interposer may be needed.

SUMMARY

The disclosure provides an external test method for an interposer which may be implemented in the wafer level. The test method may be used to evaluate the fabrication condition of the interposer without physically probing the interposer.

The disclosure provides a test method for an interposer. The test method involves an interposer and a passive transponder device. The interposer includes a plurality of conductive lines therein and a plurality of connecting contacts thereon, wherein the plurality of connecting contacts are electrically connected to the plurality of conductive lines respectively. The passive transponder device may be a radio-frequency identification (RFID) tag including at least one first circuit. The first circuit includes an open/short test circuit and at least one pair of connecting contacts. The test method contacts the plurality of connecting contacts in the RFID transponder device respectively with at least one selected connecting contacts on the interposer to form a checking area. A short-circuit or open-circuit test for the interposer is conducted through the checking area.

Based on the above, the test method for an interposer in the disclosure may be implemented in the wafer level or as an acceptance test. The test method may be used to evaluate the fabrication conditions of the interposer with no further physical contact to the interposer.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of the specification. The drawings illustrate embodiments of the disclosure and, together with the description, serve to explain the principles of the disclosure.

DETAILED DESCRIPTION OF DISCLOSED EMBODIMENTS

The disclosure provides a test method for an interposer, wherein the test may be exercised in the wafer level. The method conducts a short-circuit/open-circuit test for the interposer using a passive transponder device, and the passive transponder device may be an RFID transponder device, but is not limited thereto. In the following embodiments, the RFID transponder device is used to represent the passive transponder device, but the disclosure is not limited thereto.

Figure 1:
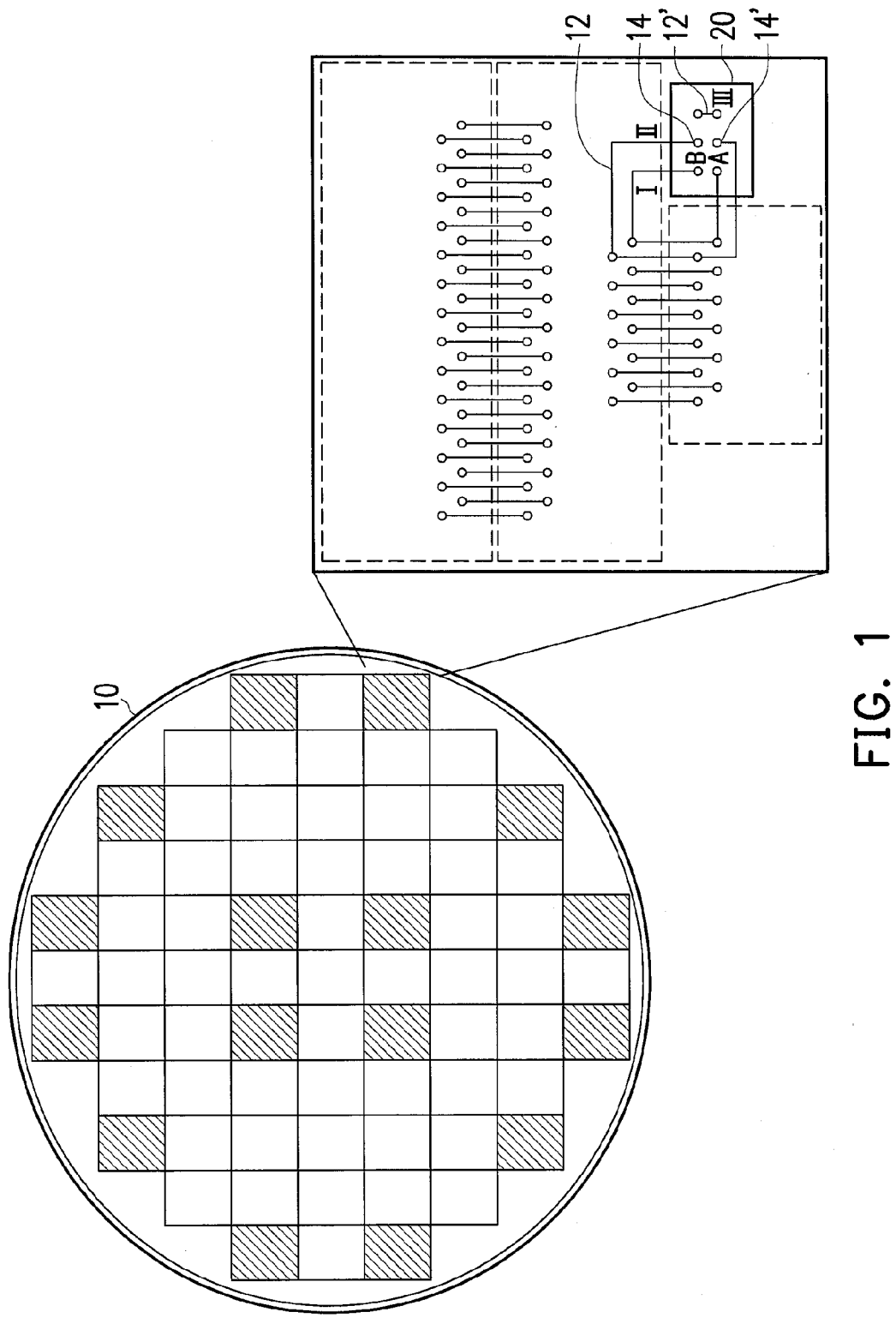
FIG. 1 is a schematic diagram illustrating an RFID transponder device contacting an interposer on a wafer.
Figure 2:
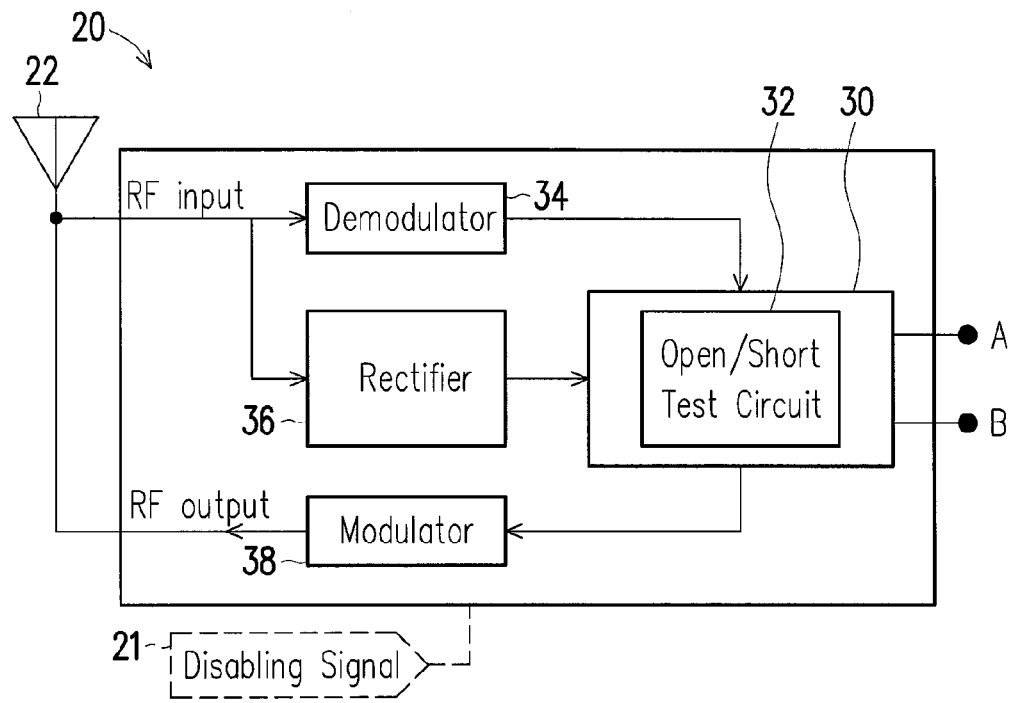
FIG. 2 is a schematic diagram illustrating an RFID transponder device.

FIG. 1 is a schematic diagram illustrating an RFID transponder device contacting an interposer on a wafer. FIG. 2 is a schematic diagram illustrating an RFID transponder device.

Referring to FIG. 1, the disclosure provides a test method for the interposer 10 in the wafer level, wherein the interposer 10 in the test method has a plurality of the conductive lines 12 and 12' and a plurality of the connecting contacts 14 and 14', in addition to the plurality of original conductive lines and the plurality of connecting contacts for stacked chips. The conductive lines 12 and 12' are located in the interposer 10, the connecting contacts 14 and 14' are located on the interposer 10, and the connecting contact 14 and the connecting contact 14' are electrically connected to the conductive line 12 or the conductive line 12'. In an exemplary embodiment, the connecting contacts 14 and 14' and the conductive line 12 may be electrically connected to the original conductive lines and connecting contacts to form a longer path, such as path I and path II in the figure. The connecting contact 14, the starting point of path I, is connected to the connecting contact 14', the end point, by the conductive line 12 electrically connected to the original conductive lines and connecting contacts. Another connecting contact 14, the starting point of path II, is connected to another connecting contact 14', the end point, by another conductive line 12 electrically connected to the original conductive lines and connecting contacts. In another exemplary embodiment, another connecting contact 14, the starting point of path III, is connected to another connecting contact 14', the end point, by a conductive line 12' not electrically connected to the original conductive lines and connecting contacts, but used as a redundant conductive line for monitoring a possible open circuit in the conductive line.

The interposer 10 may be used in a chip-stack device, such as the stacked FPGA. The interposer 10 may also include through-silicon visa (TSVs), but is not limited thereto. The upper surface on the interposer 10 may connect a plurality of chips, and TSVs may be used to connect the upper surface to the lower surface and form the connecting contacts of a chip package on the lower surface through the interposer 10. The material of the interposer 10 is, for instance, silicon or glass, but is not limited thereto. In an embodiment, the interposer 10 does not have any active component, and the connection of the conductive line 12 may not be checked by a built-in self-test method. However, the application of the test method for an interposer revealed in the disclosure is not limited in the interposer 10 not having any active component. If there are active components in the interposer 10, the connection of the conductive line on the interposer may still be checked by the test method revealed in the disclosure.

Referring to FIG. 1 and FIG. 2, the RFID transponder device 20 used to conduct the open-circuit/short-circuit test on the interposer 10 may be stacked on the interposer 10. In an exemplary embodiment, the RFID transponder device 20 includes at least one antenna 22, a rectifier 36, a modulator 38, a demodulator 34, a first circuit 30, and at least one pair of the connecting contacts A and B. In an exemplary embodiment, the RFID transponder device 20 includes at least one antenna 22, a rectifier 36, a modulator 38, a demodulator 34, and a first circuit 30.

The first circuit 30 includes an open/short test circuit 32 and at least one pair of the connecting contacts A and B, or a combination thereof. The connecting contacts A and B are respectively connected to the first circuit 30. The connecting contact A is in contact with the selected connecting contact 14 on the interposer 10, and the connecting contact B is in contact with the connecting contact 14' on the interposer 10. In the case of open-circuit test, the connecting contact 14 and the connecting contact 14' may be the two connecting contacts of the single conductive line 12. In the case of short-circuit test, the connecting contact 14 and the connecting contact 14' may be the two connecting contacts of the conductive line 12 and the conductive line 12' not originally connected. In an embodiment, the layout of connecting contacts 14 and 14' on the interposer 10 follow specific size and pitch rules, and therefore, the RFID transponder device 20 does not require to be designed or custom made for a different interposer 10, but only needs to provide corresponding connections on the interposer 10.

In FIG. 1 and FIG. 2, the RFID transponder device 20 is represented as including a pair of connecting contacts A and B. However, the disclosure is not limited thereto. The RFID transponder device 20 may also include a plurality of pairs of connecting contacts A and B in contact with the at least one selected connecting contacts 14 to form a plurality of checking areas.

Figure 3:
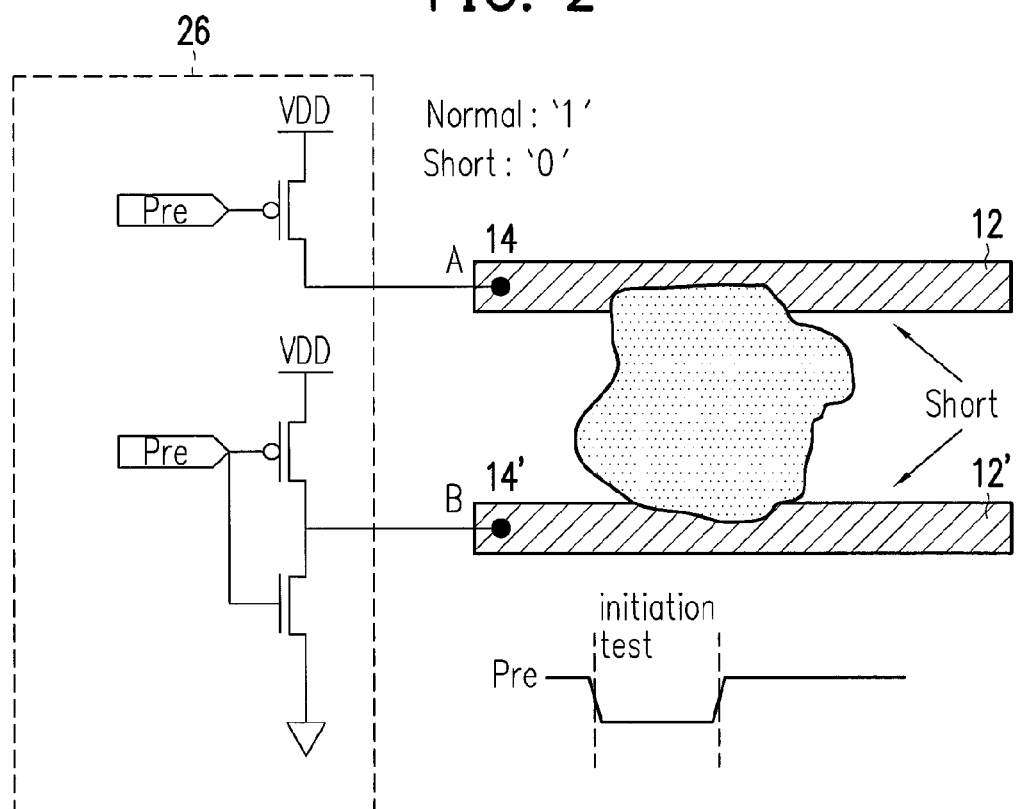
FIG. 3 is a schematic diagram illustrating a short-circuit test for the connection conditions of the conductive lines on an interposer using an RFID transponder device.
Figure 4:
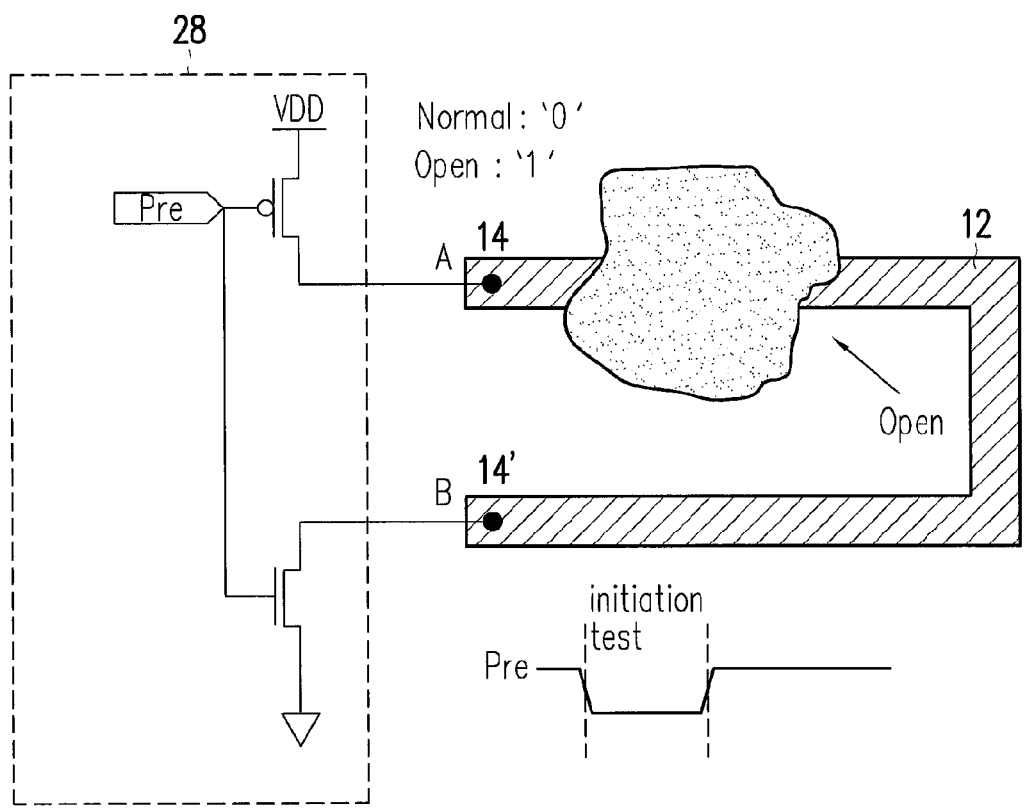
FIG. 4 is a schematic diagram illustrating an open-circuit test for the connection condition of the conductive lines on an interposer using an RFID transponder device.

FIG. 3 is a schematic diagram illustrating a short-circuit test for the connection conditions on an interposer using an RFID transponder device. FIG. 4 is a schematic diagram illustrating an open-circuit test for the connections on an interposer using an RFID transponder device.

Referring to FIG. 2 to FIG. 4, in an embodiment, the open/short test circuit 32 includes the short-circuit test circuit 26 and the open-circuit test circuit 28. The short-circuit test circuit 26 is illustrated in FIG. 3, and the open-circuit test circuit 28 is illustrated in FIG. 4, but are not limited thereto. Any known short-circuit test circuit or open-circuit test circuit is covered by the scope of the disclosure. Moreover, the rectifier 36, the modulator 38, the demodulator 34 and/or the first circuit 30 in the RFID transponder device may be connected to a disabling signal 21 having the function of disabling the RFID transponder device 20 after the testing is completed to prevent the product from being interfered by RF signals after mass production.

In an exemplary embodiment, the procedure of contacting the connecting contacts A and B in the RFID transponder device 20 respectively with the selected connecting contacts 14 and 14' may be conducted before, during, or after the interposer 10 is connected to any chip. In other words, when contacting the connecting contacts A and B in the RFID transponder device 20 respectively with the selected connecting contacts 14 and 14', the interposer 10 is not connected to any chip. Or, when contacting the connecting contacts A and B in the RFID transponder device 20 respectively with the selected connecting contacts 14 and 14', the interposer 10 is simultaneously connected to at least one chip. Or, when contacting the connecting contacts A and B in the RFID transponder device 20 respectively with the selected connecting contacts 14 and 14', the interposer 10 is already connected to all chips.

Referring to FIG. 2, the test method for the interposer 10 is to contact the connecting contacts A and B in the RFID transponder device 20 respectively with the selected connecting contacts 14 and 14' on the interposer 10 to form a checking area, and measuring an open-circuit or short-circuit condition for the interposer 10 through the checking area. In other words, when the external interrogator device receives an RF input through the antenna 22 and then the RF input is demodulated by the demodulator 34 to generate a start signal, the open/short test circuit 32 is activated, and the open-circuit or short-circuit test for the interposer 10 is conducted through the checking area at the single conductive line 12 connecting the connecting contact 14 and the connecting contact 14' or at the two conductive lines connecting the connecting contact 14 and the connecting contact 14'. Then, the test result is modulated by the modulator 38 and transmitted through the antenna 22 to the external interrogator to report the open/short test result.

Referring to FIG. 3, when testing the conductive line 12 and the conductive line 12' not originally connected by using the short-circuit test circuit 26, the connecting contacts A and B of the short-circuit test circuit 26 are first respectively connected to the connecting contact 14 and the connecting contact 14'. Then, the conductive line 12 connecting the connecting contact A and the conductive line 12' connecting the connecting contact B are charged by a precharge signal Pre (also known as a control signal) to a high voltage level (VDD) that is later discharged at the connecting contact B. If the conductive line 12 and the conductive line 12' of the connecting contact A and the connecting contact B are properly fabricated, then the return value of the connecting contact A is a high voltage level or a one. When the conductive line 12 of the connecting contact A and the conductive line 12' of the connecting contact B are short-circuited, the return value of the connecting contact A is a low voltage level or a zero.

Referring to FIG. 4, when testing the single conductive line 12 connecting the connecting contact 14 and the connecting contact 14' by using the open-circuit test circuit 28, the connecting contacts A and B of the open-circuit test circuit 28 in the RFID transponder device 20 are first respectively contacted with the connecting contacts 14 and 14' on the interposer 10. Then, the conductive line 12 of the connecting contact A and the connecting contact B is charged by a precharge signal Pre to a high voltage level (VDD) that is later discharged at the connecting contact B. If the conductive line 12 connecting the connecting contact A and the connecting contact B is properly fabricated, then the return value of the connecting contact A is a low voltage level or a zero. When the conductive line 12 connecting the connecting contact A and the connecting contact B is an open circuit, the return value of the connecting contact A is a high voltage level or a one.

The connection condition of the conductive line 12 or 12' may be determined by the return value. Once collecting a plurality of connection conditions, if the conditions are poor, it may be deduced that the yield of the interposer 10 is most likely low, and the disposal of the interposer 10 may be considered, depending on the situation to avoid expensive chips stacked on the interposer 10 being scrapped and causing unnecessary waste.

A plurality of checking areas are formed in the test method for an interposer in the disclosure using a cheap RFID transponder device stacked on the interposer, and the the RFID transponder device is used to report the connection conditions of the checking areas to wirelessly test the connection conditions of the interposer. Since the return value of a regular interposer is a fixed sequence composed of zeros and ones, the return value may be encoded into an electronic tag. The quality of the interposer may be determined by detecting the amount of abnormal electronic tags. Therefore, the test method for an interposer in the disclosure may be implemented in the wafer level, and the test method may be used to evaluate the fabrication condition of the interposer. Moreover, the RFID transponder device may receive a disabling signal to turn off the function of the RFID transponder device when the testing is complete, so as to prevent the product from being interfered by RF signals after mass production.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:

1. A test method for an interposer, comprising:
    providing an interposer, wherein the interposer has a plurality of conductive lines therein and a plurality of connecting contacts thereon, and the plurality of connecting contacts are electrically connected to the plurality of conductive lines respectively;
    providing a passive transponder device, wherein the passive transponder device comprises:
    at least one first circuit, wherein the at least one first circuit comprises an open/short test circuit and at least one pair of connecting contacts, and the at least one pair of connecting contacts are connected to the at least one first circuit; and
    contacting the at least one connecting contacts in the passive transponder device respectively with at least one selected connecting contacts on the interposer to form a checking area, and conducting a short-circuit/open-circuit test for the interposer through the checking area,
    wherein when conducting a short-circuit test or an open-circuit test for the interposer through the checking area, a precharge signal is first provided to charge the connecting contacts of the interposer in contact with the at least one first circuit to a high voltage level, then a test result is observed to evaluate the short-circuit test or the open-circuit test for the interposer,
    wherein the conductive lines are originally isolated in order to disallow electrical connections in the short-circuit test, and the conductive lines are originally connected in order to allow electrical connections in the open-circuit test.

2. The method of claim 1, wherein the plurality of conductive lines are electrically connected to a chip.

3. The method of claim 1, wherein the plurality of conductive lines are not electrically connected to a chip.

4. The method of claim 1, wherein when contacting the at least one pair of connecting contacts in the passive transponder device respectively with the selected connecting contacts, the interposer is not attached to a chip.

5. The method of claim 1, wherein when contacting the at least one connecting contacts in the passive transponder device respectively with the selected connecting contacts, the interposer is already attached to a chip.

6. The method of claim 1, wherein when contacting the at least one connecting contacts in the passive transponder device respectively with the selected connecting contacts, the interposer is simultaneously attached to a chip.

7. The method of claim 1, wherein there are no active components in the interposer.

8. The method of claim 1, wherein the passive transponder device further receives a disabling signal for disabling the passive transponder device.

9. The method of claim 1, wherein the passive transponder device comprises a plurality of pairs of connecting contacts, and the pairs of the connecting contacts are in contact with the selected contacts on the interposer to form a plurality of checking areas.

10. The method of claim 1, wherein the passive transponder device is part of a chip to be attached to the interposer.

11. The method of claim 1, wherein the method is implemented in the wafer level.

12. The method of claim 1, wherein the passive transponder device further comprises at least an antenna, a rectifier, a modulator, and a demodulator.

13. The method of claim 1, wherein passive transponder device is an RFID transponder device.

* * * * *